United States Patent

Chen et al.

[11] Patent Number: 5,572,061
[45] Date of Patent: Nov. 5, 1996

[54] ESD PROTECTION DEVICE FOR ANTIFUSES WITH TOP POLYSILICON ELECTRODE

[75] Inventors: Wenn-Jei Chen, Sunnyvale; Huan-Chung Tseng, Santa Clara; Yeouchung Yen; Linda Liu, both of San Jose, all of Calif.

[73] Assignee: Actel Corporation, Sunnyvale, Calif.

[21] Appl. No.: 289,678

[22] Filed: Aug. 12, 1994

Related U.S. Application Data

[63] Continuation-in-part of Ser. No. 290,029, Aug. 12, 1994, Pat. No. 5,498,895, and a continuation-in-part of Ser. No. 277,673, Jul. 19, 1994, Pat. No. 5,519,248, which is a continuation of Ser. No. 87,942, Jul. 7, 1993, Pat. No. 5,369,054.

[51] Int. Cl.$^6$ ............................ H01L 29/00; H01L 23/48
[52] U.S. Cl. ........................................ 257/530; 257/756
[58] Field of Search ...................... 257/530, 756

[56] References Cited

U.S. PATENT DOCUMENTS

| | | |
|---|---|---|
| 4,748,490 | 5/1988 | Hollingsworth . |
| 4,821,096 | 4/1989 | Maloney . |
| 4,823,181 | 4/1989 | Mohsen et al. ............ 357/51 |
| 4,829,350 | 5/1989 | Miller . |
| 4,862,243 | 8/1989 | Welch et al. . |
| 4,899,205 | 2/1990 | Hamdy et al. ............ 357/51 |
| 4,941,028 | 7/1990 | Chen et al. . |
| 5,070,384 | 12/1991 | McCollum et al. . |
| 5,111,262 | 5/1992 | Chen et al. . |
| 5,166,556 | 11/1992 | Hsu et al. . |
| 5,171,715 | 12/1992 | Husher et al. . |
| 5,233,217 | 8/1993 | Dixit et al. . |
| 5,290,734 | 3/1991 | Boardman et al. . |
| 5,341,276 | 8/1994 | Whitten et al. ............ 257/530 |
| 5,498,895 | 3/1996 | Chen ............ 257/530 |

FOREIGN PATENT DOCUMENTS 0416903  3/1991  European Pat. Off. .

*Primary Examiner*—J. Carroll
*Attorney, Agent, or Firm*—D'Alessandro & Ritchie

[57] ABSTRACT

The present invention is directed to providing an electrostatic discharge ("ESD") protection cell for use in an integrated circuit device including antifuses. The ESD protection cell is formed simultaneously with the antifuses that it protects and provides protection from ESD during the fabrication of the antifuses. The concept is to use thin undoped or doped polysilicon on top of antifuse material as a block etching mask for the formation of the ESD protection cells by using common etching techniques. This polysilicon mask is placed where the antifuses will be and not where the ESD protection cells will be. The polysilicon mask is then merged with a top polysilicon electrode during later processing. During the block etching process, the antifuse material layer is compromised in the region about the ESD protection cells. Where the antifuse material layer is an O—N—O sandwich, the top oxide and nitride layers may be etching during the block etching process leaving the thin bottom oxide layer and some or no residual bottom oxide of the ONO composite antifuse material layer for forming the ESD protection cell. Since etching into the bottom oxide of the ONO composite antifuse material layer will not degrade, but will enhance the ESD protection capability of the ESD protection cell, it is perfectly acceptable to also etch the bottom oxide layer as well as long as proper process control is allowed. The ESD protection cell may be used with antifuses having diffusion or polysilicon type bottom electrodes and polysilicon top electrodes. An advantage of this structure is its ability to be fabricated at high temperature for improved film characteristics and reliability.

10 Claims, 1 Drawing Sheet

ESD PROTECTION DEVICE FOR ANTIFUSES WITH TOP POLYSILICON ELECTRODE

CROSS-REFERENCE TO RELATED APPLICATION

This application is a continuation-in-part of: (1) U.S. patent application Ser. No. 08/277,673 filed Jul. 19, 1994 in the names of inventors Yeouchung Yen, Wenn-Jei Chen, Steve S. Chiang and Abdul R. Forouhi and entitled "Circuits for ESD Protection of Metal-to-Metal Antifuses During Processing" and assigned to Actel Corporation now U.S. Pat. No. 5,519,248 issued May 21, 1996 which is a continuation of U.S. patent application Ser. No. 08/087,942 filed Jul. 7, 1993 in the name of inventors Yeouchung Yen, Wenn-Jei Chen, Steve S. Chiang and Abdul R. Forouhi and entitled "Circuits for ESD Protection of Metal-to-Metal Antifuses During Processing" now U.S. Pat. No. 5,369,054 issued Nov. 29, 1994; and (2) U.S. patent application Ser. No. 08/290,029 filed Aug. 12, 1994 in the name of inventor Wenn-Jei Chen and entitled "Process ESD Protection Device For Use With Antifuses", now U.S. Pat. No. 5,498,895 issued Mar. 12, 1996.

BACKGROUND OF THE INVENTION

1. Field of the Invention

The present invention relates generally to the field of semiconductor technology. More specifically, it relates to one-time electrically programmable antifuse technology for use in field programmable logic applications. Still more specifically, the present invention is directed to a novel electrostatic discharge ("ESD") protection device for use during the fabrication of antifuses having a top electrode formed of polysilicon and a method of fabricating such an ESD protection device.

2. The Prior Art

Polysilicon ("Poly")/Oxide—Nitride—Oxide ("ONO")/N+ diffusion antifuse has long been a primary choice for production antifuse structures. Essentially it consists of a top electrode formed of Poly, an antifuse material layer consisting of a sandwich of Silicon dioxide ($SiO_2$), Silicon nitride (SiN), and $SiO_2$ and a lower antifuse electrode consisting of an N+ diffusion region. Antifuses of this type are described in U.S. Pat. No. 4,823,181 to Mohsen et al., entitled PROGRAMMABLE LOW IMPEDANCE ANTI-FUSE ELEMENT and U.S. Pat. No. 4,899,205 to Hamdy et al., entitled ELECTRICALLY-PROGRAMMABLE LOW-IMPEDANCE ANTI-FUSE ELEMENT. Such antifuse structures exhibit excellent leakage and reliability characteristics, and are thus preferred for user-programmable antifuse applications.

During the fabrication process used for manufacturing antifuse elements, the wafer is exposed to environments which are potentially harmful to the antifuse material positioned between the lower and upper antifuse electrodes. For example, reactive ion plasma etching techniques employed to define small geometry features can result in the accumulation of large static charges giving rise to high voltages across sensitive areas in the integrated circuit being fabricated.

Antifuse materials which are engineered to rupture at predictable (and often relatively low) voltages are very sensitive to this phenomenon and the static charge buildup occurring during processing can easily damage the antifuse device and alter its electrical characteristics without any predictability. The resulting damaged antifuse device will therefore have unpredictable characteristics both with respect to breakdown voltage and with respect to long term stability in either the "on" (conducting) or "off" (non-conducting) states.

OBJECTS AND ADVANTAGES OF THE INVENTION

Accordingly, it is an object of the present invention to provide an ESD protection device useful for protecting a number of antifuses from static discharge damage during the manufacturing process.

A further object of the present invention is to provide an ESD protection device similar in operation to an antifuse and adapted to be fabricated simultaneously with the antifuses that it is designed to protect, but which has a lower breakdown voltage and higher leakage current than those antifuses that it is designed to protect.

These and many other objects and advantages of the present invention will become apparent to those of ordinary skill in the art from a consideration of the drawings and ensuing description of the invention.

SUMMARY OF THE INVENTION

The present invention is directed to providing an electrostatic discharge ("ESD") protection cell for use in an integrated circuit device including antifuses. The ESD protection cell is formed simultaneously with the antifuses that it protects and provides protection from ESD during the fabrication of the antifuses. The concept is to use thin undoped or doped polysilicon on top of antifuse material as a block etching mask for the formation of the ESD protection cells by using common etching techniques. This polysilicon mask is placed where the antifuses will be and not where the ESD protection cells will be. The polysilicon mask is then merged with a top polysilicon electrode during later processing. During the block etching process, the antifuse material layer is compromised in the region about the ESD protection cells. Where the antifuse material layer is an O—N—O sandwich, the top oxide and nitride layers may be etching during the block etching process leaving the thin bottom oxide layer and some or no residual bottom oxide of the ONO composite antifuse material layer for forming the ESD protection cell. Since etching into the bottom oxide of the ONO composite antifuse material layer will not degrade, but will enhance the ESD protection capability of the ESD protection cell, it is perfectly acceptable to also etch the bottom oxide layer as well as long as proper process control is allowed. The ESD protection cell may be used with antifuses having diffusion or polysilicon type bottom electrodes and polysilicon top electrodes. An advantage of this structure is its full compatibility with commonly used antifuse fabrication processes. This structure is also compatible with antifuses using materials other than an ONO composite for the antifuse material layer as long as polysilicon is being used as the top electrode.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
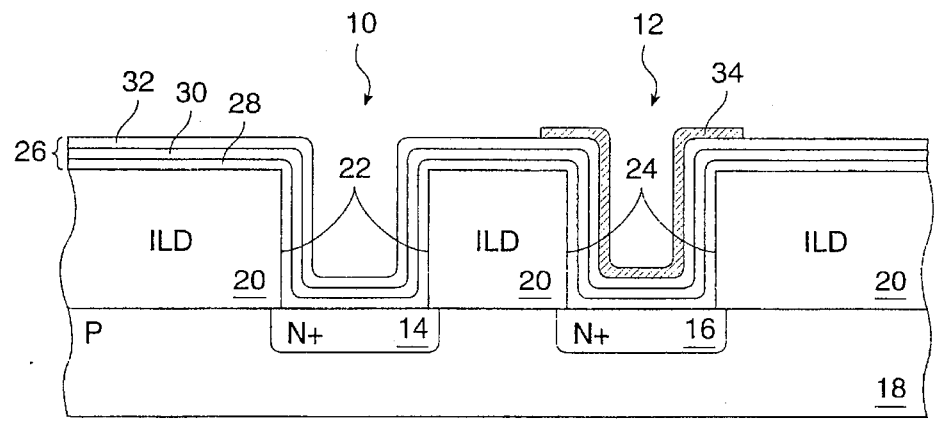
FIG. 1 is a diagram of an ESD protection cell according to the present invention prior to etch back of the antifuse material layer.

Turning now to the drawings, FIG. 1 shows an ESD protection cell 10 for use in protecting one or more antifuses 12. The essence here is to fabricate the ESD protection cell 10 much like an antifuse cell 12 but with a degraded antifuse material layer which has been partially etched into in order to make it have a lower breakdown voltage and more leakage current. In FIG. 1 a substrate 18 containing diffusion regions 14, 16 forms the base for the construction of antifuses and ESD protection cells. On top of substrate 18 is deposited an interlayer dielectric layer 20, formed preferably of a thermal oxide, which is etched back to form ESD protection cell openings 22 and antifuse cell openings 24 which expose the N+ diffusion regions 14, 16 within substrate 18 which will act as lower ESD protection cell and lower antifuse electrodes, respectively. An antifuse material layer 26 is then deposited over interlayer dielectric layer 20 and into cell openings 22, 24 so that is forms an electrical contact to the lower electrodes 14, 16. Preferably antifuse material layer 26 comprises an O—N—O (oxide—nitride—oxide) sandwich of three layers (28=oxide, 30=nitride and 32=oxide) of dielectric material. Other types of antifuse material could also be used as would be known to those of ordinary skill in the art. Over the antifuse 12 is then deposited a thin layer of doped or undoped polysilicon 34 which acts as a cap layer to protect antifuse material layer 26 in the region of antifuse 12.

Figure 2:
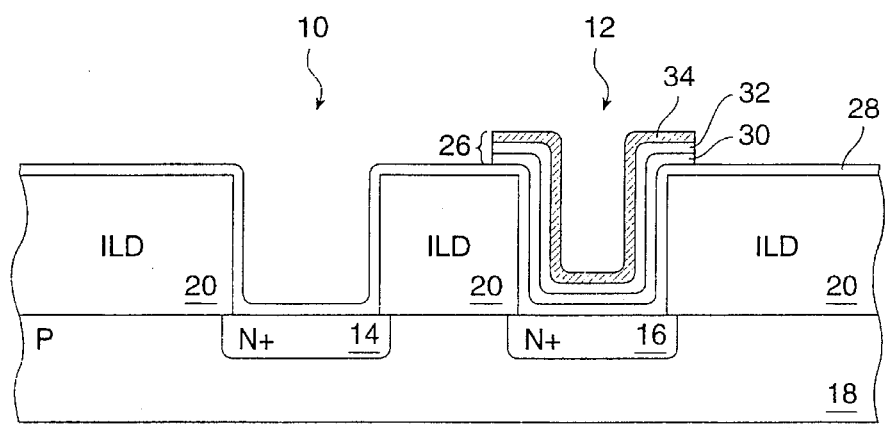
FIG. 2 is a diagram of an ESD protection cell according to the present invention after etch back of the antifuse material layer.

As shown in FIG. 2, the antifuse material layer 26 is then etched back to remove unprotected portions of oxide layer 32 and nitride layer 30 leaving oxide layer 28 to serve as the antifuse material layer for ESD protection cell 10. This operation could be conducted to leave some or all of nitride layer 30 intact, similarly, etching into oxide layer 28 would do no harm as the goal is to have a poor performing antifuse structure for ESD protection cell 10. As can be seen in FIG. 2, antifuse cell 12 now consists of an intact antifuse material layer 26 together with a thin polysilicon layer 34 on top of it.

Figure 3:
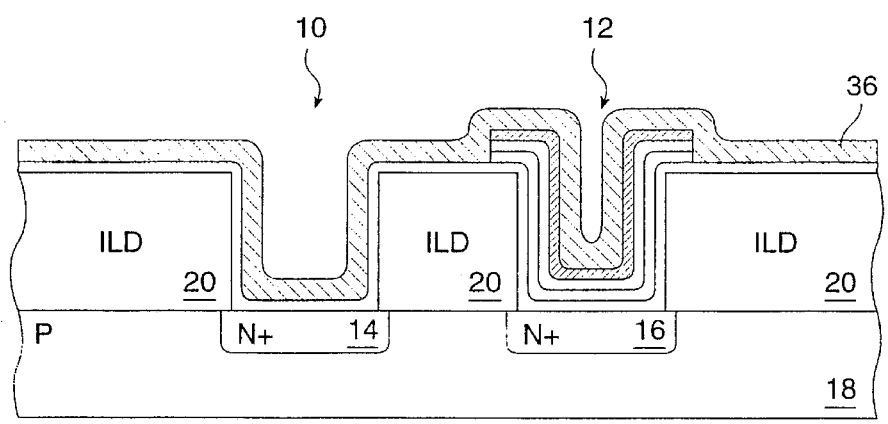
FIG. 3 is a diagram of an ESD protection cell according to the present invention in its completed state.

Turning now to FIG. 3, to complete the antifuses 12 and ESD protection cells 10, a final polysilicon layer 36 is deposited over both the ESD protection cells 10 and antifuses 12. The polysilicon layer 36 is doped to serve as an electrode as is known by those of ordinary skill in the art and combines with polysilicon layer 34 so that polysilicon layers 34 and 36 serve together as the top electrode of antifuses 12. Polysilicon layer 36 serves as the top ESD protection cell electrode and has an antifuse material layer 28 which is much weaker than antifuse material layer 26 so that it will easily break down in the presence of ESD to form a conductive link through layer 28 in the region of ESD protection cell 10 to bypass electrical charge which could damage antifuses 12.

According to a presently preferred embodiment of the present invention, interlayer dielectric layer 20 has a thickness in the range of 500 Å–4000 Å with 1000 Å presently preferred; oxide layer 28 has a thickness in the range of 10 Å–60 Å with 35 Å presently preferred; nitride layer 30 has a thickness in the range of 40 Å–200 Å with 75 Å presently preferred; oxide layer 32 has a thickness in the range of 10 Å–60 Å with 30 Å presently preferred; polysilicon layer 34 has a thickness in the range of 50 Å–3000 Å with 200 Å presently preferred and is presently preferred to be undoped; polysilicon layer 36 has a thickness in the range of 1000 Å–4000 Å with 2500 Å presently preferred and is doped to a very low resistivity of about $4\times10^{-4}$ ohm-cm. Where the etch back of the antifuse material layer consumes the top oxide layer 32 and the nitride layer 30 and leaves the bottom oxide layer 28 intact, the antifuse material layer in the region of the ESD protection cell will have the same thickness as that of oxide layer 28. Because only high temperature materials are used in the antifuse and ESD protection cell, the processing of all of the steps described herein may be carried out in the range of 500° C.–1100° C. with 950° C. presently preferred. This high temperature processing yields better films and more reliable devices. High temperature processing also aids in the combination of polysilicon layer 34 and polysilicon layer 36 (since layers 34 and 36 are formed of the same material, they can thus be sintered and merged to form and behave as a single layer). An antifuse and ESD protection cell built in accordance with the foregoing description can be expected to have an antifuse programming voltage of about 10–30 volts and an ESD breakdown voltage of about 5 volts.

While the lower electrodes have been shown as diffusion-type electrodes, polysilicon electrodes could also be used for the lower electrodes as is well known to those of ordinary skill in the art.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An integrated circuit device formed on a substrate, said integrated circuit comprising:

an antifuse including:
an antifuse lower electrode disposed in or over said substrate;
an interlayer dielectric layer disposed over said antifuse lower electrode;
an antifuse cell opening in and through said interlayer dielectric layer and exposing a portion of said antifuse lower electrode;
an antifuse material layer of a first thickness disposed over said interlayer dielectric layer, in said antifuse cell opening, and over said antifuse lower electrode;
a first polysilicon layer disposed over said antifuse material layer in a region over said antifuse lower electrode;
a second polysilicon layer disposed over said first polysilicon layer; and an ESD protection cell disposed over said substrate and including:
an ESD protection cell lower electrode disposed in or over said substrate;
said interlayer dielectric layer disposed over said ESD protection cell lower electrode;

an ESD protection cell opening in and through said interlayer dielectric layer and exposing a portion of said ESD protection cell lower electrode;

said antifuse material layer disposed over said interlayer dielectric layer, in said ESD protection cell opening, and over said ESD protection cell lower electrode and partially etched back to a second thickness in the region over said ESD protection cell lower electrode, said second thickness being less than said first thickness;

said second polysilicon layer also disposed over said antifuse material layer in the region above said ESD protection cell lower electrode.

2. An integrated circuit device formed on a substrate, said integrated circuit comprising:

an antifuse including:

an antifuse lower electrode disposed in or over said substrate;

an interlayer dielectric layer disposed over said antifuse lower electrode;

an antifuse cell opening of a first areal size in and through said interlayer dielectric layer and exposing a portion of said antifuse lower electrode;

an antifuse material layer of a first thickness disposed over said interlayer dielectric layer, in said antifuse cell opening, and over said antifuse lower electrode;

a first polysilicon layer disposed over said antifuse material layer in a region over said antifuse lower electrode;

a second polysilicon layer disposed over said first polysilicon layer; and an ESD protection cell disposed over said substrate and including:

an ESD protection cell lower electrode disposed in or over said substrate;

said interlayer dielectric layer disposed over said ESD protection cell lower electrode;

an ESD protection cell opening of said first areal size in and through said interlayer dielectric layer and exposing a portion of said ESD protection cell lower electrode;

said antifuse material layer disposed over said interlayer dielectric layer, in said ESD protection cell opening, and over said ESD protection cell lower electrode and partially etched back to a second thickness in the region over said ESD protection cell lower electrode, said second thickness being less than said first thickness;

said second polysilicon layer also disposed over said antifuse material layer in the region above said ESD protection cell lower electrode.

3. An integrated circuit according to claim 1 wherein said antifuse lower electrode and said ESD protection cell lower electrode are formed of polysilicon.

4. An integrated circuit according to claim 2 wherein said antifuse lower electrode and said ESD protection cell lower electrode are formed of polysilicon.

5. An integrated circuit according to claim 1 wherein said antifuse lower electrode and said ESD protection cell lower electrode are formed of diffusion.

6. An integrated circuit according to claim 2 wherein said antifuse lower electrode and said ESD protection cell lower electrode are formed of diffusion.

7. An integrated circuit device according to claim 1 wherein said antifuse material layer includes a first lowest antifuse layer formed of an oxide, a second antifuse layer formed of a nitride disposed over said first lowest antifuse layer and a third topmost antifuse layer formed of an oxide disposed over said second antifuse layer.

8. An integrated circuit device according to claim 2 wherein said antifuse material layer includes a first lowest antifuse layer formed of an oxide, a second antifuse layer formed of a nitride disposed over said first lowest antifuse layer and a third topmost antifuse layer formed of an oxide disposed over said second antifuse layer.

9. An integrated circuit device according to claim 7 wherein when said antifuse material layer is partially etched back, all of said third topmost antifuse layer formed of an oxide is removed in said region over said ESD protection cell lower electrode.

10. An integrated circuit device according to claim 8 wherein when said antifuse material layer is partially etched back, all of said third topmost antifuse layer formed of an oxide is removed in said region over said ESD protection cell lower electrode.

* * * * *